(12) United States Patent
Kajigaya

(10) Patent No.: US 9,263,115 B2
(45) Date of Patent: Feb. 16, 2016

(54) SEMICONDUCTOR DEVICE

(71) Applicant: Micron Technology, Inc., Boise, ID (US)

(72) Inventor: Kazuhiko Kajigaya, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/476,433

(22) Filed: Sep. 3, 2014

(65) Prior Publication Data

US 2015/0063020 A1  Mar. 5, 2015

(30) Foreign Application Priority Data

Sep. 3, 2013 (JP) .................. 2013-182178

(51) Int. Cl.
*G11C 11/16* (2006.01)
*G11C 13/00* (2006.01)
*G11C 27/02* (2006.01)

(52) U.S. Cl.
CPC ........ *G11C 11/1675* (2013.01); *G11C 11/1693* (2013.01); *G11C 13/0061* (2013.01); *G11C 13/0069* (2013.01); *G11C 27/02* (2013.01); *G11C 2013/0092* (2013.01)

(58) Field of Classification Search
CPC ........... G11C 11/1675; G11C 11/1693; G11C 13/0061; G11C 13/0069; G11C 27/02; G11C 2013/0092
USPC ................... 365/158, 171, 173; 257/421, 427
See application file for complete search history.

(56) References Cited

U.S. PATENT DOCUMENTS

| 8,184,470 | B2 * | 5/2012 | Toda | G11C 11/5685 365/148 |
|---|---|---|---|---|
| 8,189,417 | B2 * | 5/2012 | Oh et al. | 365/211 |
| 8,644,062 | B2 * | 2/2014 | Kim | G11C 8/08 365/148 |
| 8,670,269 | B2 * | 3/2014 | Kwon | G11C 29/50008 365/158 |
| 8,848,430 | B2 * | 9/2014 | Costa | G11C 5/02 365/158 |
| 2004/0114429 | A1 * | 6/2004 | Ehiro | G11C 11/5685 365/158 |
| 2004/0252551 | A1 * | 12/2004 | Iwata | G11C 11/16 365/158 |
| 2005/0232001 | A1 * | 10/2005 | Tsuji | G11C 11/16 365/158 |
| 2010/0214825 | A1 * | 8/2010 | Chung | G11C 11/16 365/158 |
| 2010/0309718 | A1 * | 12/2010 | Oh | G11C 11/16 365/171 |
| 2011/0063899 | A1 * | 3/2011 | Ogimoto | G11C 11/16 365/158 |
| 2012/0155158 | A1 * | 6/2012 | Higo | G11C 11/1677 365/158 |
| 2014/0347918 | A1 * | 11/2014 | Lee | G11C 11/1675 365/158 |
| 2015/0002199 | A1 * | 1/2015 | Hyun | H03L 7/00 327/160 |

OTHER PUBLICATIONS

Lakys, Yahya et al., "Self-Enabled "Error-Free" Switching Circuit for Spin Transfer Torque MRAM and Logic", IEEE Transactions on Magnetics, vol. 48, No. 9, Sep. 2012, 2403-2406.

* cited by examiner

*Primary Examiner* — Vu Le
*Assistant Examiner* — Sung Cho
(74) *Attorney, Agent, or Firm* — Dorsey & Whitney LLP

(57) ABSTRACT

A method includes measuring a first pulse width of a resistance variable memory cell coupled between a first terminal and a second terminal, the first pulse width including a period from starting a first data writing of the resistance variable memory cell by applying a voltage between the first and second terminals to ending the first data writing of the resistance variable memory cell, and measuring a second pulse width of the resistance variable memory cell coupled between the first and the second terminal. The method includes setting longer one of the first and second pulse widths in a first storage area as a pulse width to be used in program.

16 Claims, 16 Drawing Sheets

SEMICONDUCTOR DEVICE

REFERENCE TO RELATED APPLICATION

This application is based upon, and claims the benefit of priority of Japanese patent application No. 2013-182178, filed on Sep. 3, 2013, the disclosure of which is incorporated herein in its entirety by reference thereto.

TECHNICAL FIELD

Embodiments of the present invention relates to a write pulse width setting method, a data writing method, and a semiconductor device.

BACKGROUND

In recent years DRAM (Dynamic Random Access Memory) and flash memory are widely used as volatile and non-volatile semiconductor memory devices, respectively. With the aim of replacing these memories, there is progress in the development of various types of semiconductor memory device. Among these, variable resistance memory cells are known, in which variable resistance elements are used to store information of logic 0 and logic 1 according to resistance states thereof.

There are two ways of writing to the variable resistance elements: writing by changing a high resistance state to a low resistance state, and writing by changing a low resistance state to a high resistance state. As an example of a write operation, a bipolar switching type of variable resistance memory cell is known, in which the direction of voltage or current applied to a variable resistance element, is reversed, according to a case of writing information of logic 0 and a case of writing information of logic 1.

For example, a bipolar switching type of variable resistance element may be an STT-RAM (Spin Transfer Torque-Random Access Memory) that performs spin injection magnetization reversal writing using a magnetic tunnel junction (MTJ) element, or a Re-RAM (Resistance-Random Access Memory) that uses a metal oxide or the like.

Yahya Lakys, etc. "Self-Enabled "Error-Free" Switching Circuit for Spin Transfer Torque MRAM and Logic," IEEE TRANSACTIONS ON MAGNETICS, Vol. 48, No. 9, September 2012 (Non-Patent Literature 1) discloses an STT-RAM and an example of a bipolar switching type of write operation in an STT-RAM.

It is to be noted that the disclosure of the abovementioned related technology is incorporated herein by reference thereto.

The following analysis is given by the present inventors.

In general, with regard to one write operation for a certain one memory cell (for example, an operation of changing logic information indicated by one memory cell from logic 0 to logic 1), consideration is given to using either one of (i) one write pulse with a long time of application, or (ii) multiple write pulses of short time of application.

The Non-Patent Literature 1 principally discloses the abovementioned (i) as a "conventional" means, and the above-mentioned (ii) as a "proposed" means, in FIG. 4.

In the write operation (FIG. 4) proposed by the Non-Patent Literature 1, a whole write pulse when writing data to a magnetic tunnel junction element is divided into pulses of short duration, reads the magnetic tunnel junction element state immediately after pulse application, and stops application of the write pulse at a point in time at which the writing is judged to have succeeded.

In a write operation with regard to a general STT-RAM as described above, use of the abovementioned (i) one write pulse with a long time of application, is considered to be mainstream, but the technology proposed by this Non-Patent Literature 1 is different therefrom.

In the Non-Patent Literature 1, with regard to a write operation of either of the abovementioned (i) and (ii), there is no mention concerning how to obtain the time for which a write current is applied, or the duration of a write pulse. That is, Non-Patent Literature 1 has no mention at all concerning how to determine the pulse duration necessary for writing to a memory cell (in other words, optimum time for application of a write current or voltage) as an optimum value, or how to obtain the optimum, value thereof.

In addition, in a write operation in the abovementioned (ii) proposal of the Non-Patent Literature 1, application of a write pulse and comparison reading are alternately repeated. Application of a write pulse is ended when a comparison reading result (self-enable signal) is generated. The comparison reading result indicates that the resistance value of a memory cell has changed, that is, when magnetization direction of an MTJ element changes from a parallel state to an antiparallel state or from an anti parallel state to a parallel state. As a result, it is understood that there is no problem with regard to operation if the duration of one write pulse, as proposed by the Non-Patent Literature 1, even with somewhat rough adjustment, is sufficiently short.

It is to be noted that the following problem may be pointed out. In the technology disclosed by the Non-Patent Literature 1, there is a problem in that, since the state of the magnetic tunnel junction element is read each time a short pulse is applied, with regard to an overall data writing process, the write time increases. Furthermore, when the state of the magnetic tunnel junction element is read, in a case where the direction of current applied to the magnetic tunnel junction element is different from the direction of write current, read operations disturb write operations, and write time is further increased. As described above, in the technology disclosed by the Non-Patent Literature 1, the time for writing data to the magnetic tunnel junction element may increase.

SUMMARY

According to a first aspect of the present invention there is provided a method including measuring a first pulse width of a resistance variable memory cell coupled between a first terminal and a second terminal, the first pulse width including a period from starting a first data writing of the resistance variable memory cell by applying a voltage between the first and second terminals to ending the first data writing of the resistance variable memory cell, measuring a second pulse width of the resistance variable memory cell coupled between the first and the second terminal, the second pulse width including a period from starting a second data writing of the resistance variable memory cell by applying a voltage between the first and second terminals to ending the second data writing of the resistance variable memory cell, and setting longer one of the first and second pulse widths in a first storage area as a pulse width to be used in program.

According to a second aspect of the present invention there is provided a method including performing a pulse width measuring operation on a first resistance variable memory cell coupled between a first terminal and a second terminal, the pulse width measuring operation comprising applying a voltage between the first and second terminals, establishing a first level of a signal by the applying of the voltage, and detecting a second level of the signal, the second level being different from the first level, repeating the performing of the poise width measuring operation, and writing a data bit into a second resistance variable memory cell Coupled between a third terminal and a fourth terminal, according to a maximum one of the first pulse widths that have been, measured in the pulse width measuring operations.

According to a third aspect of the present invention there is provided a device including a memory cell array including a memory cell in which a resistance state changes in accordance with a bias being applied, a replica memory cell replicating the memory cell of the memory cell array, a measurement circuit measuring a bias application period required for changing a resistance state of the replica memory cell, and a circuit determining a maximum one of the bias application periods that the measurement circuit has measured.

BRIEF DESCRIPTIONS OF THE DRAWINGS

Figure 3:
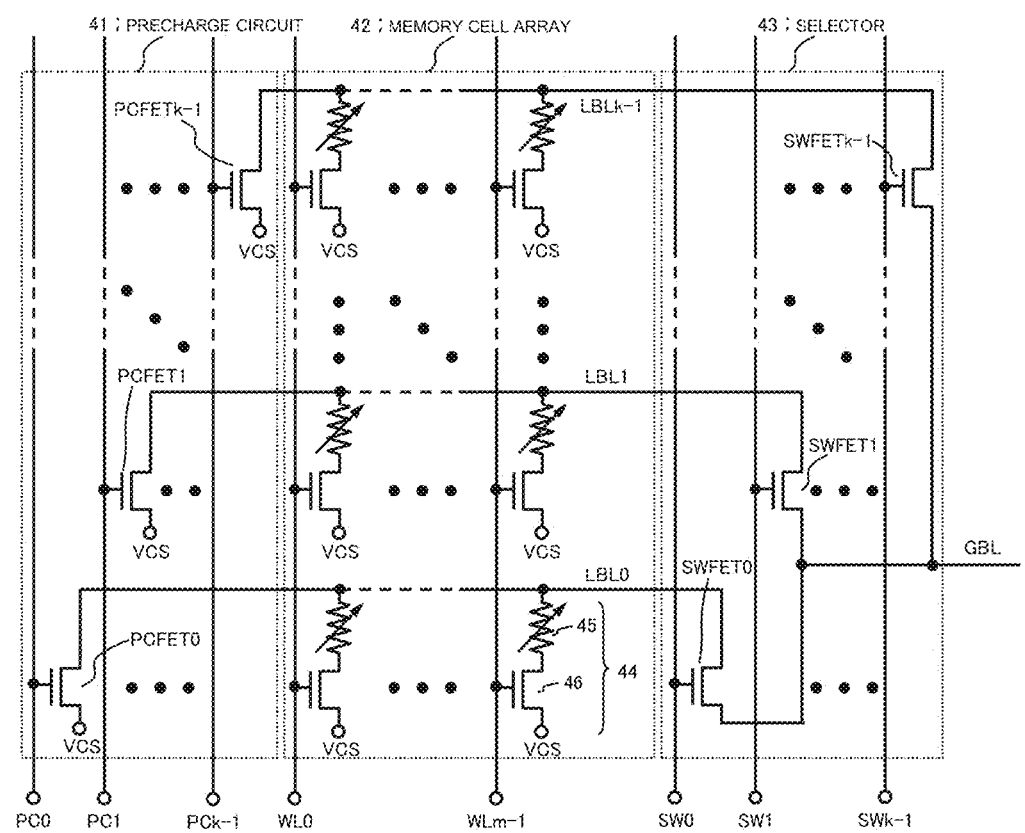

FIG. 3 is a diagram showing an example of an internal configuration and connection mode of a precharge circuit 41, a memory cell array 42 and a selector 43.

Figure 4:
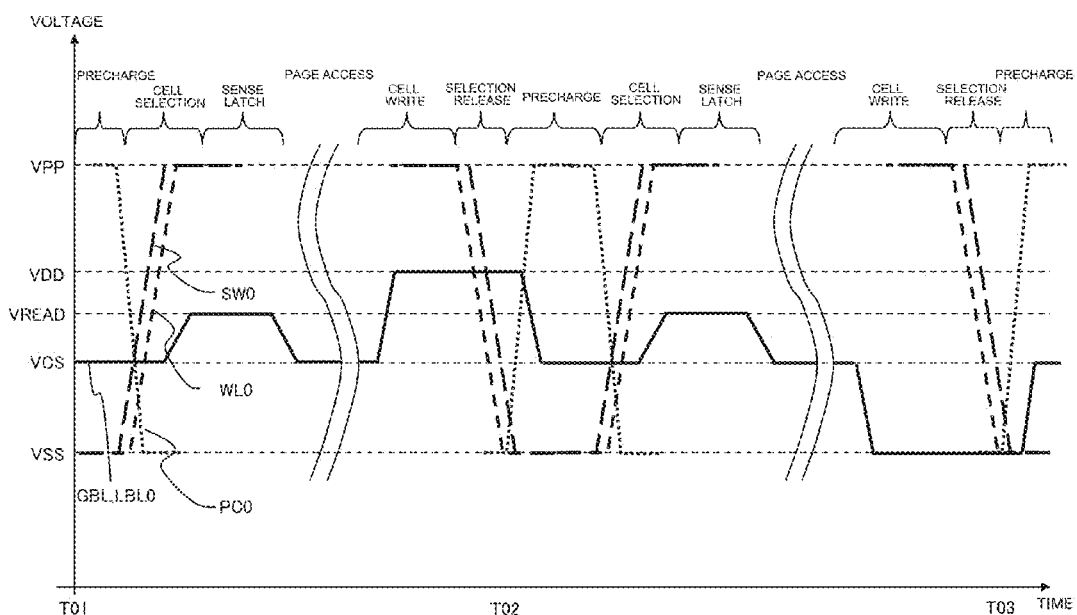

FIG. 4 is a diagram showing an example of operation waveforms of respective signals in a case where a word line WL0 and a local bit line LBL0 are selected.

Figure 5:
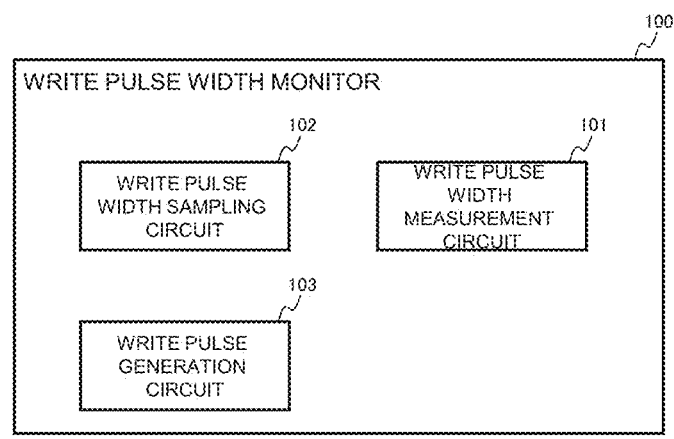

FIG. 5 is a diagram showing an example of a configuration of a write pulse width monitor 100.

Figure 6:
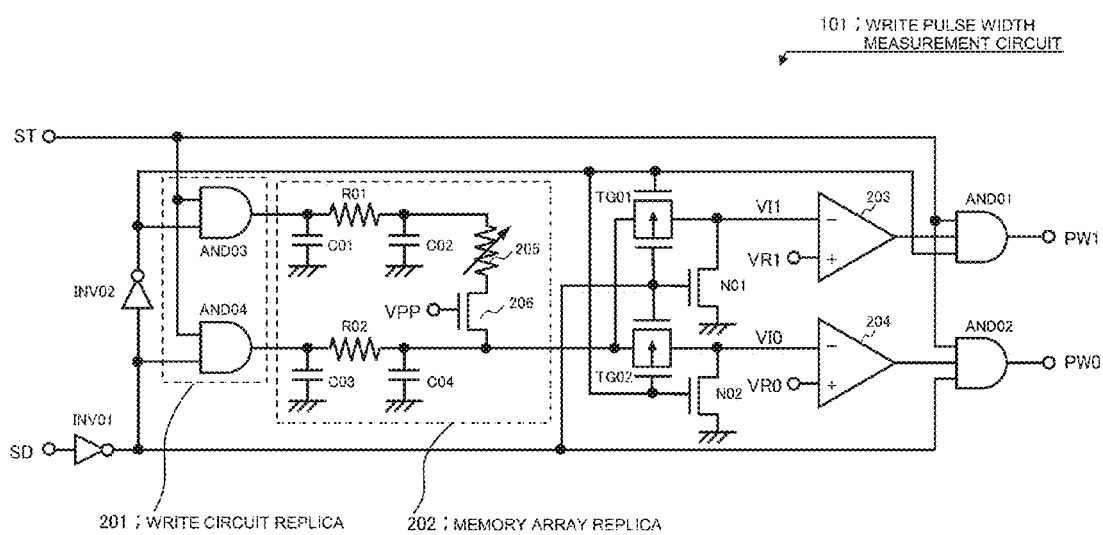

FIG. 6 is a diagram showing an example of an internal configuration of a write pulse width measurement circuit 101.

Figure 7:
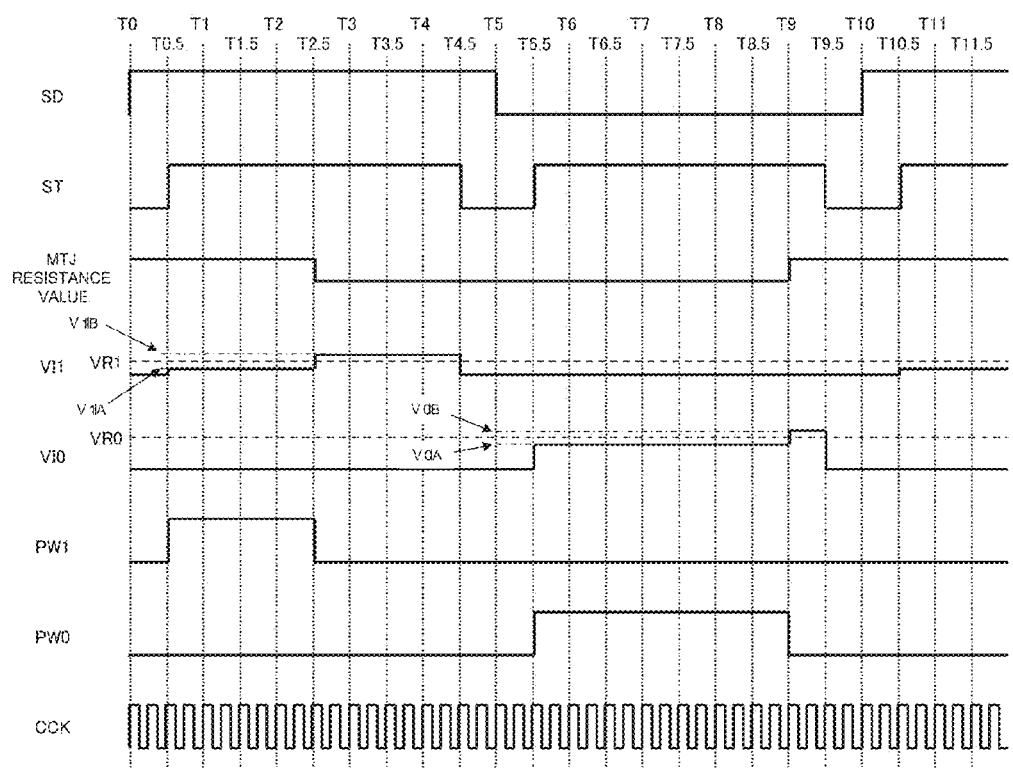

FIG. 7 is a diagram showing an example of a waveform diagram showing operation of the write pulse width measurement circuit 101.

Figure 8:
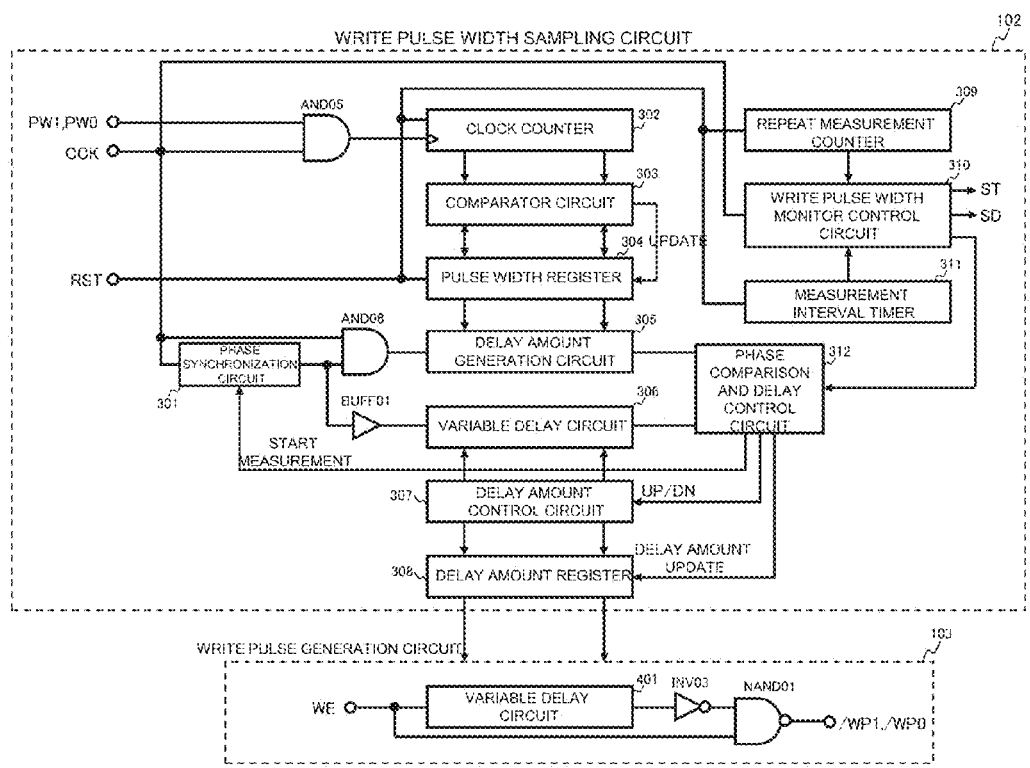

FIG. 8 is a diagram showing an example of an internal configuration of a write poise width sampling circuit 102 and a write poise generation circuit 103.

Figure 9:
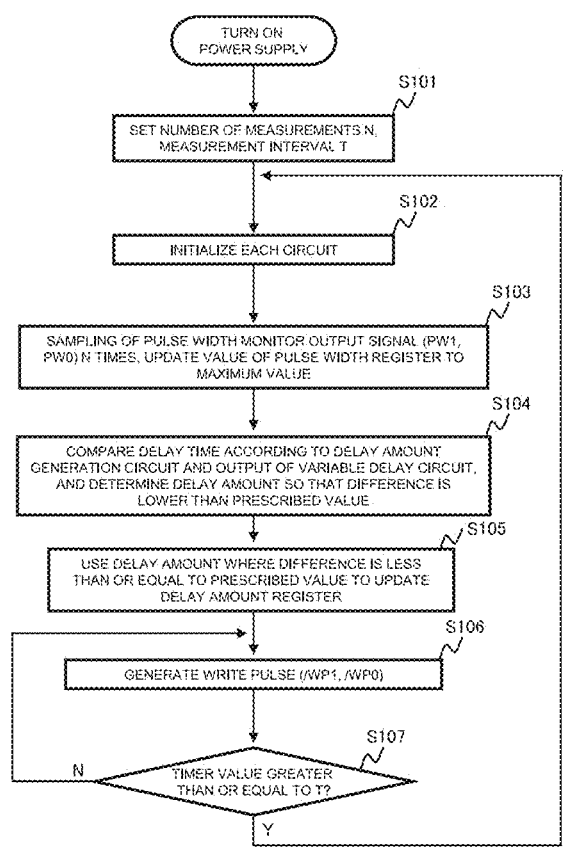

FIG. 9 is a flowchart showing an example of write pulse width monitor control.

Figure 10:
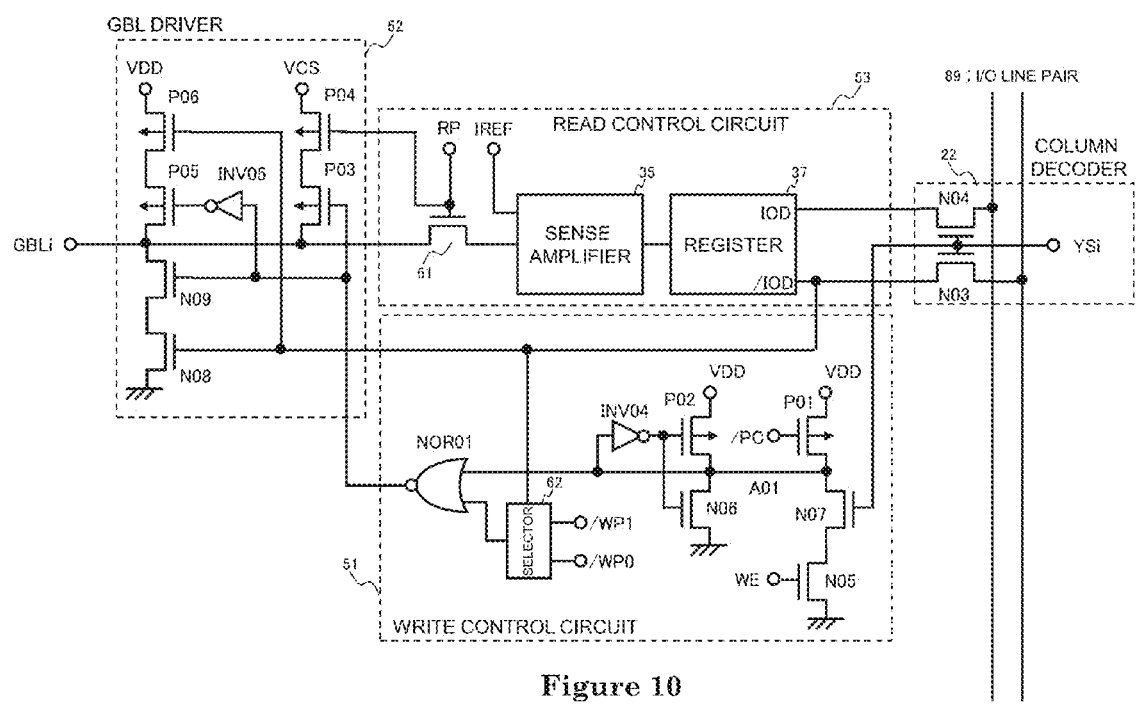

FIG. 10 is a diagram showing an example of a circuit configuration principally used in data bit reading and writing.

Figure 11:
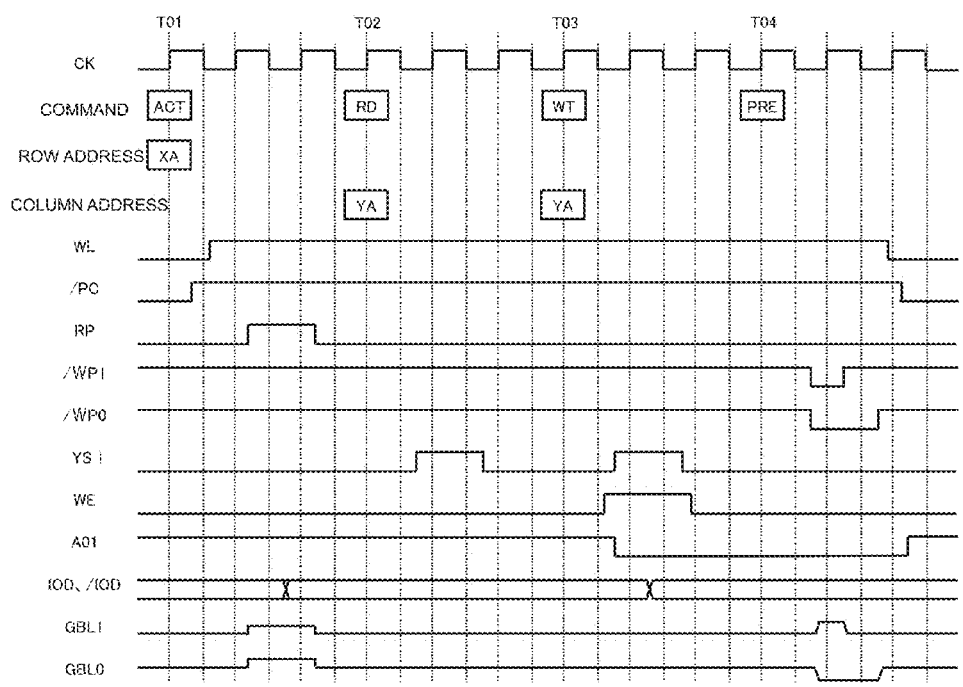

FIG. 11 is a diagram showing an example of an operation waveform (read/write operation) of the semiconductor device 1.

Figure 12:
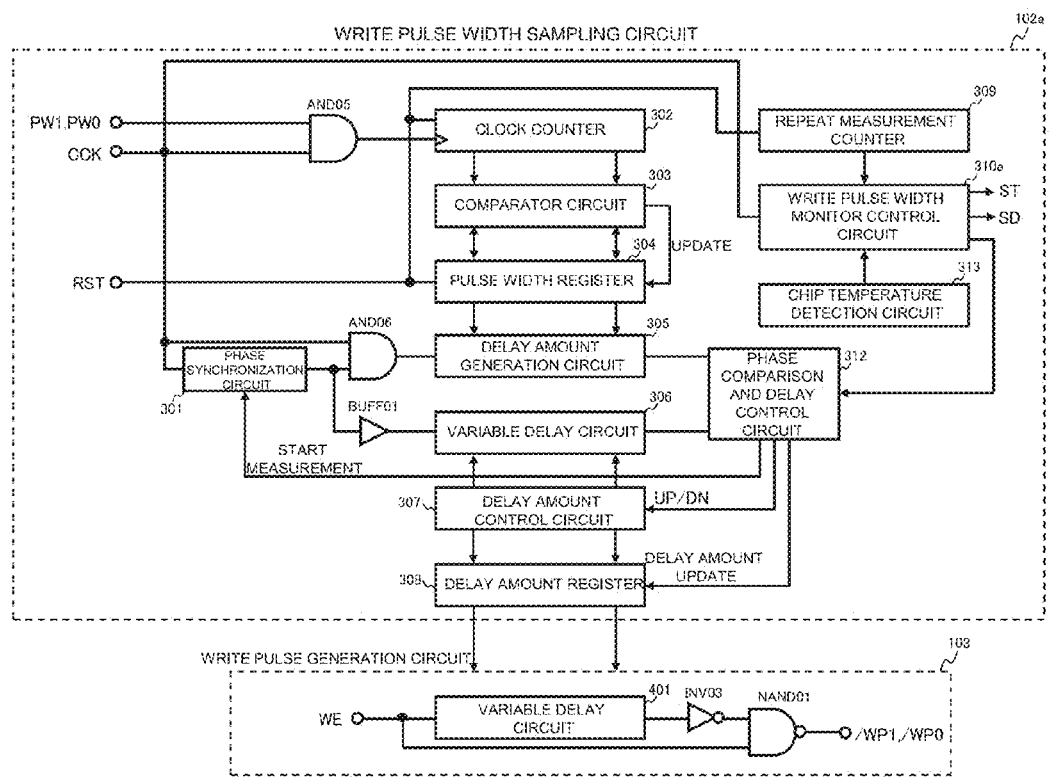

FIG. 12 is a diagram showing an example of an internal configuration of a write pulse width sampling circuit 102a and a write pulse generation circuit 103 according to a second embodiment.

Figure 13:
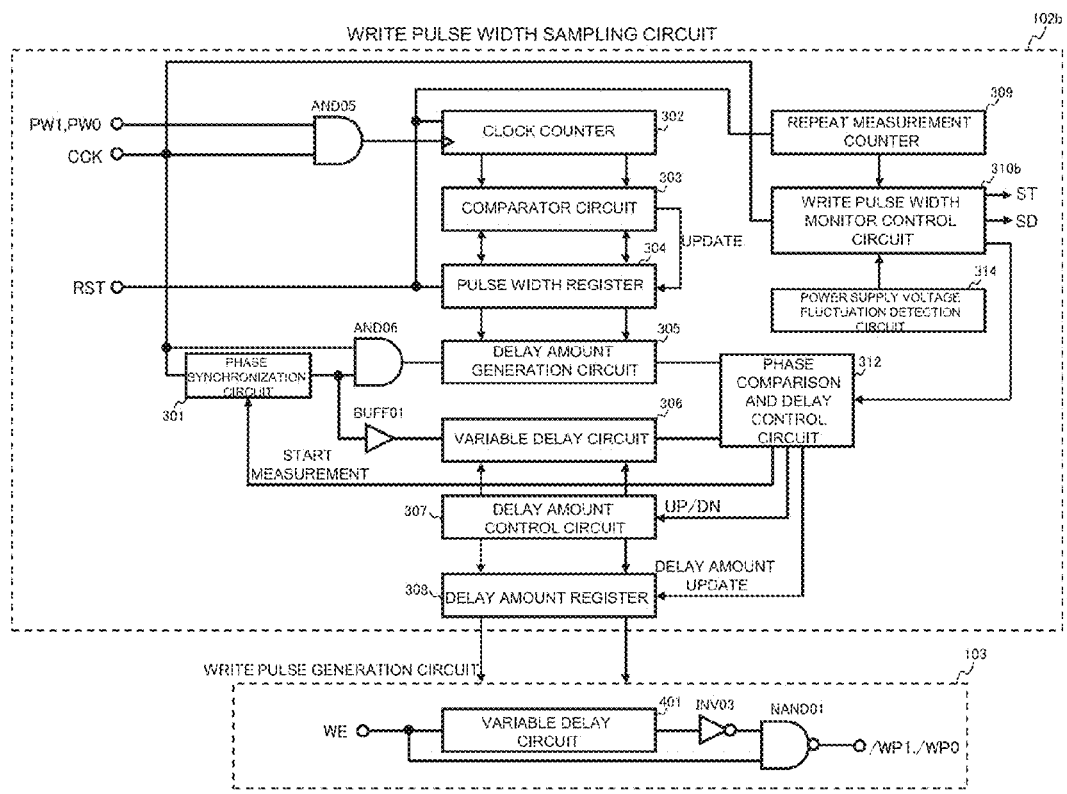

FIG. 13 is a diagram, showing an example of an internal configuration of a write pulse width sampling circuit 102b and a write pulse generation circuit 103 according to a third embodiment.

Figure 14:
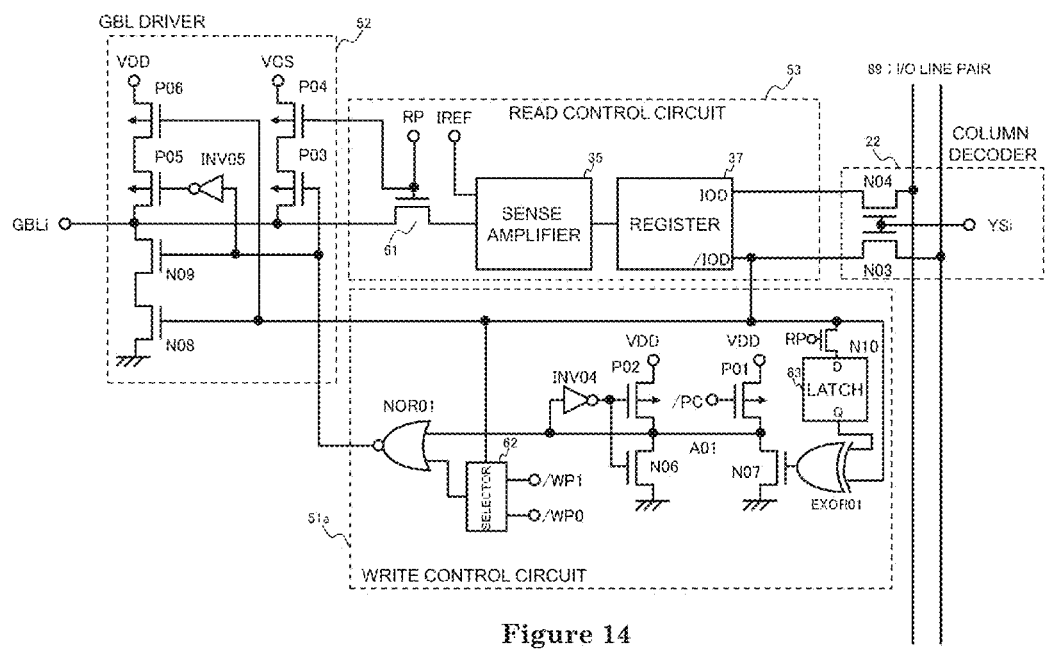

FIG. 14 is a diagram showing an example of a circuit configuration principally used in data bit reading and writing in a semiconductor device according to a fourth embodiment.

Figure 15:
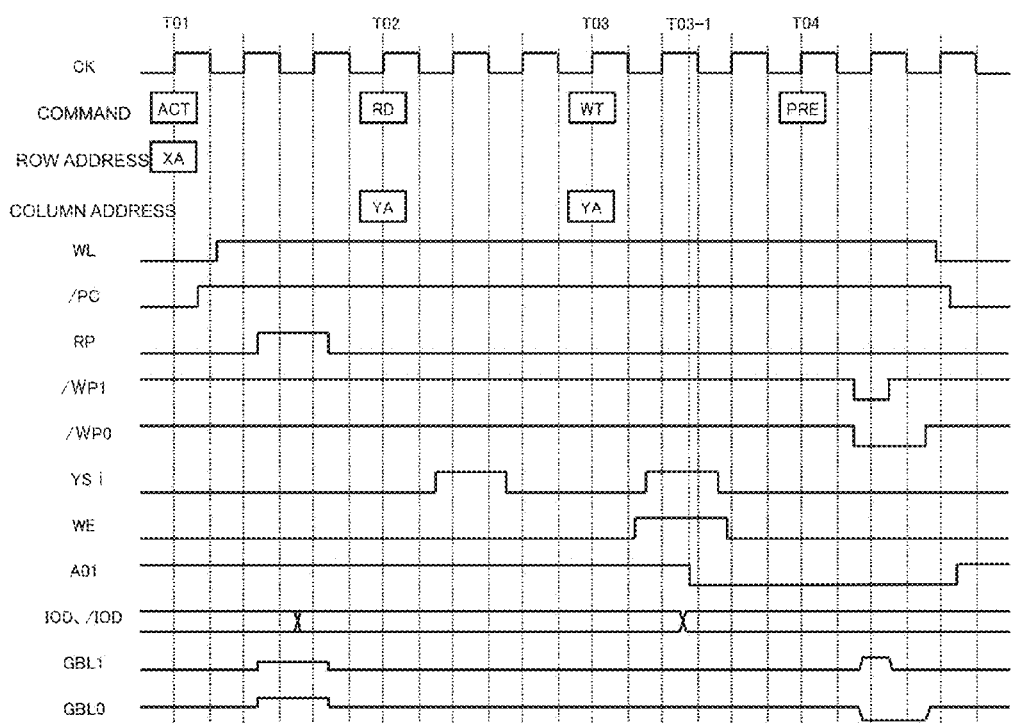

FIG. 15 is a diagram showing an example of an operation waveform of the semiconductor device according to the fourth embodiment.

Figure 16:
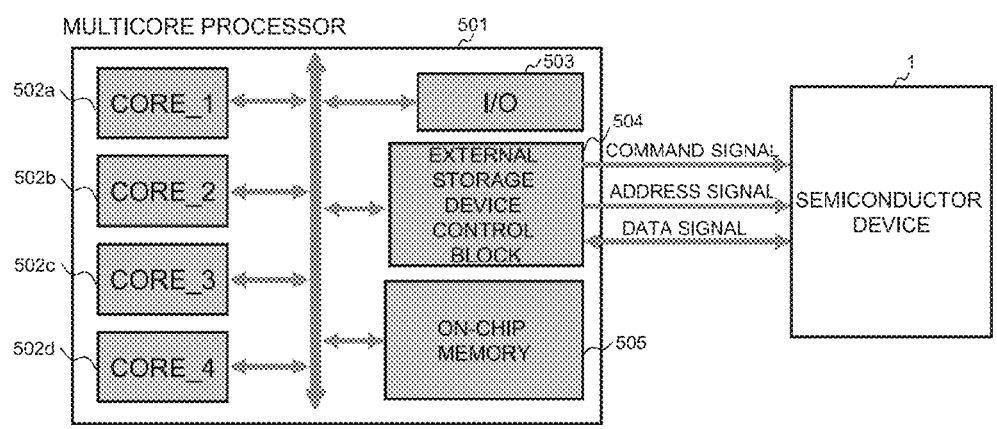

FIG. 16 is a block diagram showing a configuration of an information processing system according to a fifth embodiment.

DETAILED DESCRIPTION OF THE EMBODIMENTS

First Embodiment

A description is given concerning a first embodiment using the drawings.

Figure 1:
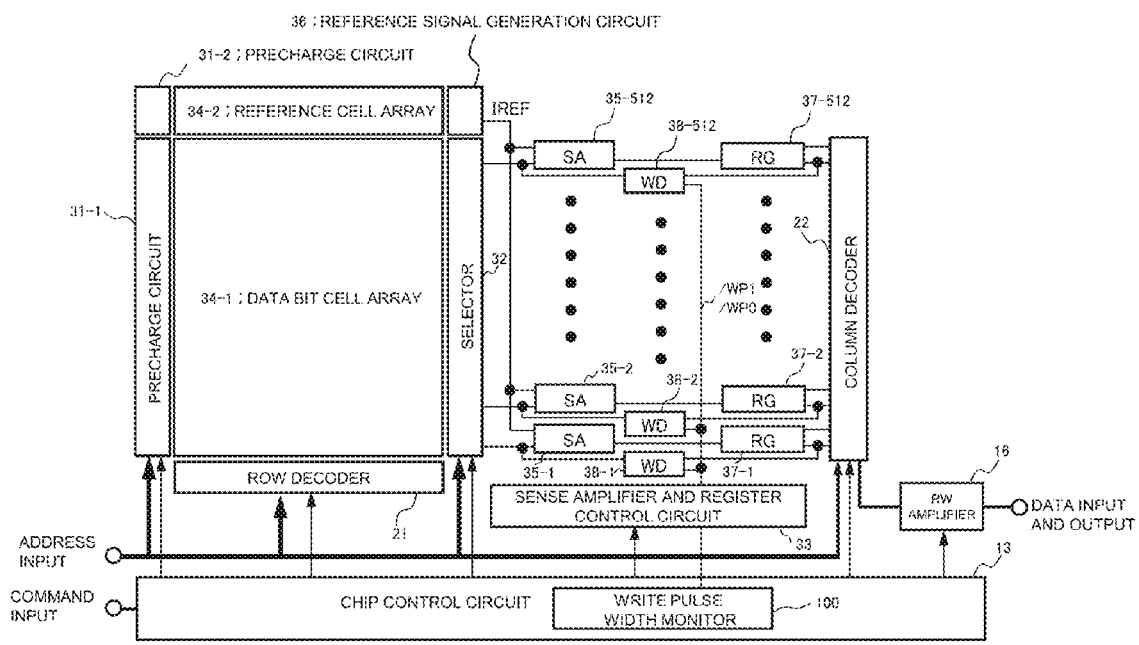
FIG. 1 is an example of a block diagram of a memory cell array 2 and peripheral circuitry according to a first embodiment.

FIG. 1 is an example of a block diagram of a memory cell array 2 and peripheral circuitry. A circuit configuration including a write pulse width monitor 100 is shown, with details described later.

In respective embodiments there is provided a method that includes measuring a first pulse width (for example, time T0.5 to T2.5 in FIG. 7) of a resistance variable memory cell (for example, a replica memory cell shown by a magnetic tunnel junction element 205 and a cell transistor 206 in FIG. 6) coupled between a first terminal and a second terminal (for example, terminals of resistors R01 and R02 shown in FIG. 6), the first pulse width including a period from starting a first data writing of the resistance variable memory cell by applying a voltage between the first and second terminals to ending the first data writing of the resistance variable memory cell; measuring a second pulse width of the resistance variable memory cell coupled between the first and the second terminal, the second pulse width including a period from starting a second data writing of the resistance variable memory cell by applying a voltage between the first and second terminals to ending the second data writing of the resistance variable memory cell; and setting longer one of the first and second pulse widths in a first storage area (for example, a pulse width register 304 in FIG. 8) as a pulse width to be used in program.

According to the method related to the respective embodiments, in a write pulse width monitor 100 shown in FIG. 1, for example, time (the first pulse width) required for writing data to a memory cell replicating a memory cell included in a data bit cell array 34-1, is measured a plurality of times, and the longer time or maximum time required for data writing is set in the first storage area. The longer pulse width or maximum pulse width among the plural measurements of the first pulse width is obtained as an optimal duration of a write pulse (in other words, the optimum time of application of a write current or voltage), and set in the first storage area. Furthermore, by writing data to the memory cell included in the data bit cell array 34-1, using the write time that is set in the first, storage area, it is possible to prevent prolongation of data write time, with respect to a magnetic tunnel junction element. This is because the maximum time is selected from among adequate times for changing a resistance state of the cell array, and is set in the first storage area.

Next, in the embodiments, there is provided a method that includes performing a pulse width measurement operation on a first resistance variable memory cell (for example, a replica memory cell shown by the magnetic tunnel junction element 205 and the cell transistor 206 in FIG. 6) to measure a first pulse width (for example, time T0.5 to T2.5 in FIG. 7) including a period from starting a first data writing of the resistance variable memory cell to ending the first data writing of the resistance variable memory cell; repeating the performing of the pulse width measurement operation; and programming a data bit into a second resistance variable memory cell (for example, a normal memory cell indicated by reference symbol 44 in FIG. 3) according to a maximum one of the first pulse widths that have been measured in the pulse width measurement operations.

According to the method related to the respective embodiments, the maximum pulse width among the plurality of measurements of the first pulse width is obtained as an optimal duration of a write pulse (in other words, the optimum time of application of a write current or voltage), and a write operation is executed using the pulse duration. By extension, it is possible to prevent prolongation of data write time.

Next, in the first to third embodiments, there is provided a device that is provided with a memory cell array (for example, the data bit cell array 34-1 of FIG. 1) including a memory cell in which a resistance state changes in accordance with a bias being applied; a replica memory cell (for example, reference symbols 205 and 206 in FIG. 6) replicating the memory cell of the memory cell array; a measurement circuit (for example, a write pulse width measurement circuit 101 in FIG. 6) measuring a bias application period required for changing a resistance state of the replica memory cell; and a circuit (for example, a comparator circuit 303 in FIG. 8) determining a maximum one of the bias application periods that the measurement circuit has measured.

Figure 2:
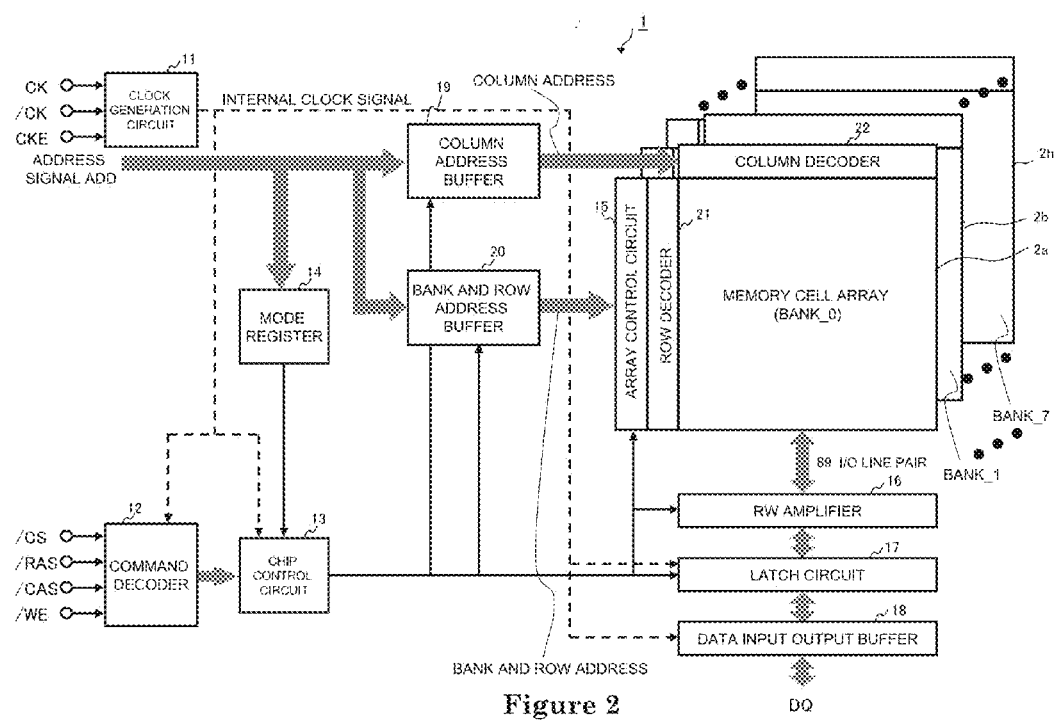
FIG. 2 is a block diagram showing an overall configuration of a semiconductor device 1 according to the first embodiment.

FIG. 2 is a block diagram showing an overall configuration of the semiconductor device 1 according to the first embodiment.

The semiconductor device 1 shown in FIG. 2 is provided with memory cell arrays. The memory cells arrays are provided with memory cell arrays 2a to 2h that use a magnetic random access memory (STT-RAM) that performs spin injection magnetization reversal writing as variable resistance memory cells. The memory cell arrays are provided with a plurality of banks, for example, banks 0 to 7. It is to be noted that in the following description, when there is no special reason to distinguish among the memory cell arrays 2a to 2h, the notation "memory cell array 2" is used.

The semiconductor device 1 is provided, with external clock terminals CK, /CK, a clock enable terminal CKE, command terminals /CS, /RAS, /CAS, /WE, a data input-output terminal DQ, and an address signal terminal ADD, as external terminals. It is to be noted that in the present specification, a signal name with a preceding "/" indicates an inverted signal or a low active signal, with respect to a corresponding signal. Accordingly, CK and /CK, for example, are mutually complementary signals.

The clock generation circuit 11 receives the external clock signals CK, /CK, and the clock enable signal CKE. The clock generation circuit 11 generates an internal clock signal required internally by the semiconductor device 1, and supplies it to respective parts.

A chip select signal /CS, a row address strobe signal /RAS, a column address strobe signal /CAS, and a write enable signal /WE are supplied to the respective command terminals /CS, /RAS, /CAS, /WE. These command signals are supplied to a command decoder 12. The command decoder 12 decodes the received command signals and supplies them to a chip control circuit 13.

Operation mode of the semiconductor device 1 is set in a mode register 14. The chip control circuit 13 receives output of the command decoder 12 and the operation mode set in the mode register 14, and generates various types of control signal based thereon. The chip control circuit 13 supplies the various types of control signal that have been generated to an array control circuit 15, a read/write amplifier (RW amplifier) 16, a latch circuit 17, a data input output buffer 18, a column address buffer 19, and a bank and row address buffer 20.

The address signal ADD includes a bank address that specifies a bank, a row address that specifies a word line WL, and a column address that specifies a bit line (configured by a global bit line GBL and a local bit line LBL). In the address signal ADD, the bank and row addresses are supplied to the bank and row address buffer 20, and a column address is supplied to the column address buffer 19.

The bank and row address buffer 20 outputs a row address specifying any of the banks 0 to 7. The row address outputted by the bank and row address buffer 20 is decoded by a row decoder 21, and a word line WL is selected in accordance with the decoding result.

The column address outputted by the column address buffer 19 is decoded by the column decoder 22, and among the plurality of bit lines a bit corresponding to the column address is selected in accordance with the decoding result. A latch circuit (not shown in the drawings) within a memory cell array corresponding to the selected bit line is connected to the read/write amplifier 16 via an I/O line pair 89.

The read/write amplifier 16 is a read amplifier circuit and a write amplifier circuit connected to a data input output terminal DQ, which is an external terminal, via the latch circuit 17 and the data input output buffer 18. An internal clock signal is supplied from the clock generation circuit 11 to the latch, circuit 17 and the data input output buffer 18 and timing of data input and output between the data input output terminal DQ and the memory cell array is controlled.

Next, a description is given concerning a memory cell array 2 and peripheral circuits thereof.

FIG. 1 is an example of a block diagram of the memory cell array 2 and the peripheral circuits thereof. As described above, a command signal generated by the command decoder 12 is inputted to (received by) the chip control circuit 13.

When there is a write or read operation, the chip control circuit 13 generates control signals in order to control respective parts: the read/write amplifier 16, the row decoder 21, the column decoder 22, precharge circuits 31-1 and 31-2, a selector 32, and a sense amplifier and register control circuit 33, in accordance with command signals.

Here, the chip control circuit 13 is configured to include the write pulse width monitor 100, to be described later. The write pulse width monitor 100 generates write pulses /WP1, /WP0 and supplies these to a write circuit 38, to be described later.

Address signals outputted by the column address buffer 19 and the bank and row address buffer 20 are sent to the precharge circuits 31-1 and 31-2, the row decoder 21, the selector 32 and the column decoder 22. These circuits that input the address signals perform selection of memory cell included in the memory cell array 2 in accordance with the address signal received.

The memory cell array 2 is configured to include the data bit cell array 34-1 and a reference cell array 34-2.

The data bit cell array 34-1 is an area including memory cells that store data supplied from outside the semiconductor device 1. That is, the data bit cell array 34-1 includes a plurality of memory cells and the data bit cell array 34-1 is configured to store data information.

The reference cell array 34-2 is an area that includes a memory cell used when generating a reference signal for size comparison with a read signal, when data is read from a memory cell included in the data bit cell array 34-1. Specifically, a memory cell having an intermediate value of resistance values corresponding to logic data "0" and "1" is included in the reference cell array 34-2. Or, two memory cells having resistance values corresponding to logic data "0" and "1" are included in the reference cell array 34-2, and a reference signal may be generated from an intermediate value of the resistance values thereof. It is to be noted that in the following description, a memory cell included in the data bit cell array 34-1 is denoted a data bit cell, and a memory cell included in the reference cell array 34-2 is denoted a reference cell. Furthermore, one page of the data bit cell array 34-1 is 512 bits.

With regard to respective areas included in the memory cell array 2, a plurality of data bit cells and reference cells are selected, according to a word line WL (not shown in the drawings) selected by the row decoder 21 in response to a row address and an active command supplied from outside. Among these cells, 512 data bit cells selected by the selector 32 are connected to one input terminal of the sense amplifiers (SA) 35-1 to 35-512 via bit lines (not shown in the drawings). It is to be noted that in the following description, when there is no special reason to distinguish among the memory cell arrays 35-1 to 35-512, the notation "sense amplifier 35" is used.

The reference cells are connected to a reference signal generation circuit 36. The reference signal generation circuit 36 generates a reference signal based on a signal read from the reference cell. The reference signal generation circuit 36 supplies the generated reference signal to another input terminal of the sense amplifier 35.

Here, the signal read from the data bit cell is in the form of a signal voltage or a signal current, and the reference signal is supplied to the sense amplifier 35, as a corresponding reference voltage or reference current. In the present embodiment, since a reference signal in the form of a signal current is used, the reference signal generated by the reference signal generation circuit 36 is denoted as reference current IREF.

In the present embodiment, a description is given of a case where the reference current IREF is shared by the 512 sense amplifiers 35, but there is no limitation to modes of supplying the reference signal. For example, a mode is possible in which the 512 sense amplifiers 35 are divided into a plurality of blocks, and a plurality of reference signals are generated and supplied to the respective blocks.

The 512-bit data bits that are sense-amplified by the sense amplifier 35 are written to registers (RG) 37-1 to 37-512. The registers 37-1 to 37-512 are units that temporarily hold data information. It is to be noted that in the following description, when there is no special reason to distinguish among the registers 37-1 to 37-512, the notation "register 37" is used. After data bits are written to the register 37, the semiconductor device 1 transitions to an access period according to a page mode.

In the access period, the semiconductor device 1 responds to a read/write command and column address supplied from outside, and performs reading and writing on at least one register that is to be accessed, among the registers 37-1 to 37-512. Thereafter, a response is given to a precharge command supplied from outside, and data held by the registers 37-1 to 37-512 is written to a data bit cell.

Data writing to the data bit cell is performed by the write circuits (WD) 38-1 to 38-512 driving the global bit line GBL. The write circuits 38-1 to 38-512 are units for writing data held by respectively corresponding registers to memory cells. The write circuits 38-1 to 38-512 are for writing data supplied from outside to the data bit cell array 34-1. It is to be noted that in the following description, when there is no special reason to distinguish among the write circuits 38-1 to 38-512, the notation "write circuit 38" is used.

The sense amplifier and register control circuit 33 executes comprehensive control with respect to the sense amplifier 35 and register 37. Specifically, the sense amplifier and register control circuit 33 generates a read pulse signal RP in accordance with a control signal supplied by the chip control circuit 13.

Next, a description is given concerning configuration and connection of the precharge circuit, the memory cell array, and the selector.

FIG. 3 is a diagram showing an example of an internal configuration and connection mode of the precharge circuit 41, the memory cell array 42 and the selector 43.

FIG. 3 is an example of a circuit diagram corresponding to one global bit line GBi (i=0 to 511) among the precharge circuit 31-1, the data bit cell array 34-1 and the selector 32.

It is to be noted that the precharge circuit 41 is a part of the precharge circuit 31-1. Similarly, the memory cell array 42 is a part of the data bit cell array 34-1, and the selector 43 is a part of the selector 32.

Referring to FIG. 3, the memory cell array 42 is configured from m (m is an integer here and in the following) word lines WL0 to WLm−1, k (k is an integer here and in the foil owing) local bit lines LBL0 to LBLk−1, and m×k memory cells 44 disposed at intersecting points thereof. The memory cells 44 are configured from a magnetic tunnel junction element 45 and a cell transistor 46. It is to be noted that the magnetic tunnel junction element 45 is a type of variable resistance element.

As shown in FIG. 3, the respective memory cells 44 are connected between a connecting node of a power supply supplying a common source voltage VCS and a connecting node of an interconnect of a local bit line LBL. The respective memory cells 44 are written to a first resistance state (for example, a low resistance state) by applying a first current in a first direction, and are written to a second resistance state (for example, a high resistance state) by applying a second current in a second direction opposite to the first direction between a first and a second terminal. It is to be noted that the common source voltage VCS is, for example, an intermediate value of VDD and VSS as shown in FIG. 4, and may be a value half the power supply voltage (½×VDD).

The precharge circuit 41 is configured to include k precharge transistors PCFET0 to PCFETk−1. Each of the respective precharge transistors PCFET Included in the precharge circuit 41 receives corresponding precharge signals PC0 to PCk−1 at a gate thereof. The respective precharge transistors PCFET are units that, when a precharge signal PC connected to a gate is controlled to a high level, precharge a local bit line LBL to the common source voltage VCS.

In a case where one local bit line LBL is selected, by controlling only a precharge signal PC corresponding to the selected one local bit line LBL to a low level, the selected local bit line LBL is isolated from the power supply line supplying the common source voltage VCS.

The selector 43 is configured to include k connection transistors SWFET0 to SWFETk−1. Each of the respective connection transistors SWFET included in the selector 43 receives corresponding connection signals SW0 to SWk−1 at a gate thereof. The respective connection transistors SWFET are units where, in a case where the semiconductor device 1 is in a precharge state, the connection signal SW is controlled to have a low level, and the respective local bit lines LBL are isolated from the global bit line GBL.

In a case where one local bit line LBL is selected, by controlling only a connection signal SW corresponding to the selected one local bit line LBL to a high level, the selected local bit line LBL is connected to the global bit line GBL. When one word line WL is selected and is in an activated state, the selected one local bit line LBL is isolated from the common source voltage VCS, and is connected to the global bit line GBL. It is to be noted that in this regard, the remaining unselected local bit lines LBL are maintained in a state of being pre charged to the common source voltage VCS.

With regard to the one memory cell 44 connected to the selected word line WL and the selected local bit line LBL, a main terminal (source or drain) of the cell transistor 46 is connected to the common source voltage VCS, and one end of the magnetic tunnel junction element 45 is connected to the local bit line LBL and the global bit line GBL. Meanwhile, with regard to the remaining k−1 memory cells 44 connected to the selected word line WL and an unselected local bit line LBL, both ends are connected to the common source voltage VCS, so that even if the cell transistor 46 is ON, a voltage is not applied to the magnetic tunnel junction element 45. As a result, since a current flows to the magnetic tunnel junction element 45, data stored by the memory cell 44 is not destroyed.

FIG. 4 is a diagram showing an example of operation waveforms of respective signals in a case where a word line WL0 and a local bit line LBL0 are selected.

In a period between time T01 and T02 in FIG. 4, data "0" corresponding to a high resistance state is read in response to an active command as described later, and thereafter, when a page access period of time has elapsed, data "1" corresponding to a low resistance state is written in response to a precharge command.

(Operation of Reading Data "0")

In the precharge period, the precharge signals PC0 to PCk−1 are controlled to the voltage VPP, and the connection signals SW0 to SWk−1 and the word lines WL0 to WLm−1 are controlled to the voltage VSS. The local bit line LBL is precharged to the common source voltage VCS, and the global bit line GBL is precharged to the common source voltage VCS by a GBL driver 52 to be described later.

In the cell selection period thereafter, by respectively controlling the precharge signal PC0 to the voltage VSS, and the connection signal SW0 and the word line WL0 to the voltage VPP, the local bit line LBL0 is connected to the global bit line GBL. In this regard, before starting a sense latch period, potentials of the global bit line GBL and the local hit line LBL0 are set and held at a read voltage VREAD, and a read current IREAD0 flows in the memory cell.

Since the read current IREAD0 has a small current value corresponding to the memory cell that is in a high resistance state, it is smaller than the current value of a reference current IREF.

In the sense latch period thereafter, current difference between the read current IREAD0 and the reference current IREF is sense-amplified by the sense amplifier 35, and data "0" is held in the register 37. It is to be noted that in the sense latch period, the potentials of the global bit line GBL and the local bit line LBL0 are substantively held at the read voltage VREAD.

Accompanying the ending of the sense latch period, the potentials of the global bit line GBL and the local bit line LBL0 are the common source voltage VCS. Thereafter, the semiconductor device 1 transitions to a page access period.

In the page access period, data is read from the register 37 in response to a read command. Or, data is written to the register 37 in response to a write command. Page access is performed with regard to the register 37, the potential of the global bit line GBL is held at the common source voltage VCS, and the states of respective types of control signal do not change. That is, in the page access period, there is no memory cell access.

(Operation of Writing Data "1")

The cell write period is a period in which data of the register 37 that has been written by column access, is writ ten to a memory cell in response to a precharge command. Specifically, in the cell write period, in response to writing of data "1", the write circuit 38 drives the potentials of the global bit line GBL and the local bit line LBL0 at the voltage VDD, and writes the data "1" to the data bit cell.

In a selection release period thereafter, the word line WL0 and connection signal SW0 are controlled to the voltage VSS.

In the precharge period thereafter, the precharge signal PC0 is controlled to the voltage VPP, and the potential of the local bit line LBL0 is pre charged to the common source voltage VCS. The potential of the global bit line GBL, is precharged to the common source voltage VCS, by the write circuit 38.

In a period from time T02 to T03 in FIG. 4, data "1" corresponding to a low resistance state is read in response to an active command, and then after going through a page access period, data "0" corresponding to a high resistance state is written in response to a precharge command. In the period from time T02 to T03 in FIG. 4, with regard to an operation in a cell selection period after the precharge period, since there is no difference from an operation of reading data "0", a description thereof is omitted.

(Operation of Reading Data "1")

In a case of reading data "1", before the start of a sense latch period, the potentials of the global bit line GBL and the local bit line LBL0 are set and held at the read voltage VREAD, and a read current IREAD1 flows to the memory cell. Since the read current IREAD1 has a large current value corresponding to the memory cell being in a low resistance state, it is larger than the current value of a reference current IREF.

In the sense latch period thereafter, current difference between the read current IREAD1 and the reference current IREF is sense-amplified by the sense amplifier 35, and data "1" is held in the register 37. In the sense latch period, the potentials of the global bit line GBL and the local bit line LBL0 are substantively held at the read voltage VREAD. Accompanying the end of the sense latch period, the potentials of the global bit line GBL and the local bit line LBL0 are at the common source voltage VCS.

Thereafter, the semiconductor device 1 transitions to a page access period; since there is no difference between operation at this time and operation when reading, a description is omitted.

(Operation of Writing Data "0")

In the cell write period corresponding to a precharge command, in response to writing of data "0", the write circuit 38 drives the potentials of the global bit line GBL and the local bit line LBL0 to the voltage VSS, and writes the data "0" to the data bit cell. Since there is no difference between operation in a precharge period of a selection release period thereafter and an operation of reading data "0", a description is omitted.

Next a detailed description is given concerning the write pulse width monitor 100.

FIG. 5 is a diagram showing an example of a configuration of the write pulse width monitor 100 shown in FIG. 1.

As shown in FIG. 5, the write pulse width monitor 100 is configured to include the write pulse width measurement circuit 101, a write pulse width sampling circuit 102, and the write pulse generation circuit 103.

FIG. 6 is a diagram showing an example of an internal configuration of the write pulse width measurement circuit 101 shown in FIG. 5.

The write pulse width measurement circuit 101 inputs a timing signal ST and a data signal SD, and outputs pulse width monitor output signals PW1, PW0. The timing signal ST and the data signal SD are signals supplied from the write pulse width sampling circuit 102. The pulse width monitor output signal PW1 is a signal indicating a period required when writing data "1" to a memory cell. In the same way, the pulse width monitor output signal PW0 is a signal indicating a period required when writing data "0" to a memory cell.

The write pulse width measurement circuit 101 is configured to include a write circuit replica 201, a memory array replica 202, inverter circuits INV01 and INV02, transfer gates TG01 and TG02, N channel MOS transistors N01 and N02, comparators 203 and 204, and AND circuits AND01 and AND02.

The write circuit replica 201 includes two AND circuits AND03 and AND04, and is configured to generate a write voltage similar to a GBL driver 52 to be described later.

The memory array replica 202 is a circuit that replicates a data bit cell. Specifically, the memory array replica 202 is configured to include a magnetic tunnel junction element 205, a cell transistor 206, resistors R01 and R02, and capacitors C01 to C04, that model parasitic resistance and parasitic capacitance of interconnect (bit line and power supply line that supplies the common source voltage VCS) within the data bit cell array 34-1. The replica memory cell is configured to include the magnetic tunnel junction element 205 and the cell transistor 206.

A replica of a memory cell included in the data bit cell array 34-1 is formed by the magnetic tunnel junction element 205 and the cell transistor 206 included in the memory array replica 202. The memory cell replica is a variable resistance memory cell connected between a first terminal (one end of the resistor R01) and a second terminal (one end of the resistor R02). The memory array replica may also use an arrangement similar to an actual circuit inside the data bit cell array 34-1. In this way it is possible to improve the accuracy of the replica.

It is to be noted that output voltage of the memory array replica 202 is supplied as an input voltage VI1, via the transfer gate TG01, to an inverting input terminal of the comparator 203. A reference voltage VR1 generated by a power supply generating circuit (not shown in the drawings) is supplied to a non-inverting input terminal of the comparator 203. The reference voltage VR1 is a threshold voltage for determining whether or not the input voltage VI1 corresponds to data "1". An input voltage VI0 and a reference voltage VR0, similar to the comparator 203, are supplied to an input terminal of the comparator 204.

FIG. 7 is a diagram showing an example of a waveform diagram showing operation of the write pulse width measurement circuit 101 shown in FIG. 6.

At time T0, since data "0" is held, the resistance value (resistance value of MTJ) of the magnetic tunnel junction element 205, indicates a high resistance. The timing signal ST, the input voltages VI1 and VI0 inputted to the comparators 203 and 204, and the pulse width monitor output signals PW1 and PW0 are each voltage VSS. It is to be noted that while there is no limitation to the frequency of the counter clock CCK, in the present embodiment, a signal of frequency with a 4 cycle operation in a period of time T0 to T1 is supplied. However, in order to improve accuracy of the pulse width monitor, it is desirable that the frequency of the counter clock CCK be high.

(Write Time Measurement for Data "1")
A Description is Given of Measuring Write Pulse Width for Data "1"

At time T0, the data signal SD is controlled to the voltage VDD.

At time T0.5, when the timing signal ST is controlled to the voltage VDD, the pulse width monitor output signal PW1 is driven to the voltage VDD. In this regard, the AND circuit AND03, on receiving the signal ST at a high level and an output signal of INV02 at a high level, outputs a signal at a high level. The AND circuit AND04, on receiving the signal ST at a high level and an output signal, of INV01 at a low level, outputs a signal at a low level. In this way, the write circuit replica 201 flows a write current in the direction of the cell transistor 206 from the magnetic tunnel junction element 205 in the memory array replica 202.

When the magnetic tunnel junction element 205 is in a high resistance state, the input voltage VI1 that is a source potential of the cell transistor 206 increases (goes to VI1A level, shown in FIG. 7). Note that the input voltage VI1 at this time is a lower potential than the reference voltage VR1 in the comparator 203. Therefore, the pulse width monitor output signal PW1 maintains the voltage VDD.

Next, at time T2.5, when the magnetic tunnel junction element 205 changes to a low resistance state, since the write current value increases, the input voltage VI1 increases and becomes larger than the reference voltage VR1 (goes to VI1B level shown in FIG. 7). As a result, the pulse width monitor output signal PW1 is driven to the voltage VSS, and a pulse width for writing data "1" is outputted. In FIG. 7, time corresponding to 8 cycles (time 0.5 to T2.5) of the counter clock CCK is a write pulse width for data "1".

In this way, completion of data writing can be detected by a signal level generated according to the resistance state of a memory cell changing from a first level (for example, voltage VDD) to a second level (for example, voltage VSS). When application of a voltage bias to both ends of the memory cell is started, the signal level generated based on the resistance state of the memory cell is at a first level (for example, voltage VDD).

At time T4.5, when the timing signal ST again goes to voltage VSS, the write current stops and the input voltage VI1 is VSS. It is to be noted that in order to simplify the description here, the memory array replica circuit is driven by VDD and VSS, but for application to the array configuration shown in FIG. 3, for example, it may be understood that the circuit may be driven by VDD and VCS instead of VDD and VSS.
(Write Time Measurement for Data "0")
A description is given of a case of measuring pulse width for data "0".

At time T5, the data signal SD is controlled by the voltage VSS.

At time T5.5, when the timing signal ST is controlled by the voltage VDD, the pulse width monitor output signal PW0 is driven to the voltage VDD. In this regard, the AND circuit AND03, on receiving the signal ST at a high level and an output signal of INV02 at a low level, outputs a signal at a low level. The AND circuit AND04, on receiving the signal ST at a high level and an output signal of INV01 at a high level, outputs a signal at a high level. In this way, the write circuit replica 201 flows a write current in the direction of the magnetic tunnel junction element 205 from the cell transistor 206 in the memory array replica 202.

Since the magnetic tunnel junction element 205 is in a low resistance state in this case, the input voltage VI0 that is a source potential of the cell transistor 206 increases to a voltage the amount of a voltage drop by the resistor R02 indicating the parasitic resistance of the power supply line supplying the common source voltage VCS (goes to VI0A shown in FIG. 7). Note that the input voltage VI0 at this time is a lower potential than the reference voltage VR0 in the comparator 204. Therefore, the pulse width monitor output signal PW0 maintains the voltage VDD.

At time T9, when the magnetic tunnel junction element 205 changes to a high resistance state, since the write current value decreases, the input voltage VI0 increases and becomes larger than the reference voltage VR0 (goes to VI0B level shown in FIG. 7). As a result, the pulse width monitor output signal PW0 is driven to the voltage VSS, and a pulse width when writing data "0" is outputted. In FIG. 7, time corresponding to 14 cycles (time T5.5 to T9) of the counter clock CCK is a pulse width for writing data "0".

At time T9.5, when the timing signal ST again goes to voltage VSS, the write current stops and the input voltage VI0 also goes to voltage VSS. It is to be noted that in order to simplify the description here, the memory array replica circuit is driven by VDD and VSS, but for application to the array configuration shown in FIG. 3, for example, it may be understood that the circuit may be driven by VCS and VSS instead of VDD and VSS.

FIG. 8 is a diagram showing an example of an internal configuration of the write pulse width sampling circuit 102 and the write pulse generation circuit 103 shown in FIG. 5.

As shown in FIG. 8, the write pulse width sampling circuit 102 is configured by including a phase synchronization circuit 301, a clock counter 302, a comparator circuit 303, a pulse width register 304, a delay amount generation circuit 305, a variable delay circuit 306, a delay amount control circuit 307, a delay amount register 308, a repeat measurement counter 309, a write pulse width monitor control circuit 310, a measurement interval timer 311, a phase comparison and delay control circuit 312, two AND circuits AND05 and AND06, and a buffer circuit BUFF01. The write pulse generation circuit 103 is configured by including a variable delay circuit 401, an inverter circuit INV03, and a NAND circuit NAND01.

The write pulse width sampling circuit 102 receives the pulse width monitor output signals PW1 and PW0, the counter clock CCK, and the reset signal RST. The write pulse width sampling circuit 102 outputs the timing signal ST and the data signal SD described above.

The write pulse generation circuit 103 receives a write enable signal WE, and outputs the write pulses /WP1 and /WP0. The variable delay circuit 401 of the write pulse generation circuit 103 has a configuration in which delay amount determined based on the delay amount register 308 of the write pulse width sampling circuit 102 is set, and in response to this, time duration (application period of write bias) of the write pulses /WP1 and /WP0 outputted by the write pulse generation circuit 103 is decided.

It is to be noted that with regard to each of the write pulse width sampling circuit 102 and the write pulse generation circuit 103, there are 2 systems, for data "1" and for "0". More specifically, the write pulse width sampling circuit 102 for data "1" inputs the pulse width monitor output signal PW1, and the write pulse generation circuit 103 for data "1" generates and outputs the write pulse /WP1. The same applies to the write pulse width sampling circuit 102 and the write pulse generation circuit 103 for data "0".

(Measurement of Pulse Width)

When the power supply to the semiconductor device 1 is turned on, or when a mode register set command is inputted to the semiconductor device 1, the number of times N a repeat measurement of the write pulse width is performed, and the interval T at which a repeat measurement routine is run are set in the mode register 14.

Thereafter, accompanying activation of a reset signal RST, a repeat measurement counter 309, a measurement interval timer 311, a clock counter 302, and a pulse width register 304 are initialized, and the write pulse width monitor control circuit 310 sends a timing signal ST and a data signal SD to the write pulse width measurement circuit 101, in synchronization with the counter clock CCK.

When the timing signal ST and the data signal SD are sent to the write pulse width measurement circuit 101, measurement of pulse width using the pulse width monitor output signals PW1 and PW0 is started.

The clock counter 302 counts the number of cycles of the counter clock CCK that the pulse width of the pulse width monitor output signals PW1 and PW0, inputted via the AND circuit AND05, to determine the pulse width of the pulse width monitor output signals PW1 and PW0 is equivalent to what period of the counter clock CCK.

The comparator circuit 303 compares the count value of the clock counter 302 and a value held by the pulse width register 3045 and records the larger value in the pulse width register 304.

The write pulse width monitor control circuit 310, repeats the operation described above N times, using the write pulse width sampling circuit 102 and the write pulse generation circuit 103 in the two systems for data "1" and data "0". As a result, when the measurement that is repeated N times is ended, the longest pulse width is recorded in the pulse width register 304.

When the measurement that is repeated N times is ended, the write pulse width monitor control circuit 310 runs the phase comparison and delay control circuit 312.

The phase comparison and delay control circuit 312 sends the measurement start signal to the phase synchronization circuit 301. The phase synchronization circuit 301 inputs the counter clock CCK, and in addition generates a one-off pulse, to be supplied to the AND circuit AND06 and the variable delay circuit 306.

The delay amount generation, circuit 305 generates a delay amount equivalent to the pulse width monitor output signals PW1 and PW0 from the counter clock CCK based on the value recorded in the pulse width register 304. The generated delay amount and the delay amount outputted by the variable delay circuit 306 are compared by the phase comparison and delay control circuit 312. Based on the comparison result, the phase comparison and delay control circuit 312 generates an UP/DN signal, and changes delay amount information referred to by the delay amount control circuit 307 in a direction in which the delay amounts of the two circuits draw close. The delay amount information is stored in a register (not shown in the drawings) provided in the delay amount control circuit 307 or the phase comparison and delay control circuit 312.

The phase comparison and delay control circuit 312 performs repeated phase comparisons until the difference between the delay amounts of the two circuits becomes less than a prescribed value, and ends the phase comparison at a stage at which the difference has become less than the prescribed value. The phase comparison and delay control circuit 312 uses the delay amount information to update a value of the delay amount register 308 referred to by the variable delay circuit 401 included in the write pulse generation circuit 103.

After the value of the delay amount register 308 has been updated, the write pulses /WP1 and /WP0, having pulse widths substantively the same as the maximum value of the write pulse width measured according to the sequence described above, are generated in response to activation of a write enable signal WE.

Here, while the value of the measurement interval timer 311 does not exceed the time T, data writing is performed using the write pulses /WP1 and /WP0 generated at the start of this time. On the other hand, if the value of the measurement interval timer 311 exceeds the time T, the value of the delay amount register 308 is updated. That is, when the time T is exceeded, a new write pulse width monitor sequence is started.

The above operations can be summarized as in the flowchart shown in FIG. 9.

FIG. 9 is a flowchart showing an example of write pulse width monitor control.

When the power supply to the semiconductor device 1 is turned on, in step S101 a measurement count N and measurement interval T are set in the mode register 14.

In step S102, circuits of the pulse width register 304 and the like are initialized, in response to the reset signal RST being activated.

In step S103, the write pulse width monitor control circuit 310 controls the write pulse width measurement circuit 101 and the write pulse width sampling circuit 102, performs sampling N times with regard to the pulse width monitor output signals PW1 and PW0 using the counter clock CCK, and performs updating so that the value held by the pulse width register 304 is at a maximum value. That is, measurements are performed a plurality of times with regard to pulse width (pulse width of pulse width monitor output signals PW1 and PW0) indicating a period from starting application of voltage bias at both ends of the variable resistance memory cell, until writing of data is completed.

When the above-mentioned sampling is performed N times, in step S104, the phase comparison and delay control circuit 312 compares delay time generated by the delay amount generation circuit 305 and output of the variable delay circuit 306, using the pulse width register 304 and the counter clock CCK, and controls the variable delay circuit 306 so that the difference between the two is less than or equal to a prescribed value.

In step S105, the value of the delay amount register 308 is updated, in response to the abovementioned difference being less than or equal to the prescribed value.

In step S106, the write pulses /WP1 and /WP0 are generated in response to activation of a write enable signal WE, making reference to the delay amount register 308. That is, the write pulses /WP1 and /WP0 are generated making reference to the maximum pulse width among the plural pulse width measurements, set in the storage area (the pulse width register 304).

In step S107, the value of the measurement interval timer 311 and the measurement interval T are compared, and if the value of the measurement interval timer 311 is greater than or equal to the measurement interval T, processing from step S102 is repeated. That is, when a prescribed time has elapsed after the maximum pulse width among the plural first pulse width measurements has been set in the first storage area (the pulse width register 304) as a pulse width to be used in an operation of writing data to the memory cell, a plurality of measurements are again made of a second pulse width indicating a period from starting application of a voltage bias to both ends of the memory cell until writing of data is completed, and the maximum pulse width among the plural second pulse width measurements is set in a second storage area (the pulse width register 304) as a pulse width to be used in an operation of writing data to the memory cell. The first storage area and the second storage area are the same physical area, being the pulse width register 304.

FIG. 10 is a diagram showing an example of a circuit configuration principally used in data bit reading and writing.

FIG. 10 shows a configuration of a column decoder 22, a read control circuit 53, a write control circuit 51, a GBL driver 52, and interconnect connecting these. It is to be noted that the configuration shown here is a configuration that corresponds to the circuit blocks of the sense amplifier (SA) 35, the register (RG) 37, the write circuit 38, and the column decoder 22 of FIG. 1. It is to be noted that the suffix "i" in FIG. 10 is the value of any of 1 to 512 as in FIG. 1.

The read control circuit 53 is configured to include the sense amplifier 35 and the register 37. The column decoder 22 is configured to include N-channel MOS transistors N03 and N04 corresponding to each global bit line GBL.

The write control circuit 51 is a circuit included in the write circuit 38, and is configured to include three N-channel MOS transistors, two P-channel MOS transistors, an inverter circuit INV04, a NOR circuit NOR01, and a selector 62. The GBL driver 52 is configured to include two N-channel MOS transistors, four P-channel MOS transistors, and an inverter circuit INV05.

The column decoder 22, the read control circuit 53, the write control circuit 51, and the GBL driver 52 are used in access of a data hit cell.

In a row command operation in this access, the GBL driver 52 and the read control circuit 53 operate as follows. In a state where the data hit cell is selected according a word line WL and a local bit line LBL, when the read pulse signal RP is controlled to a high level, the N-channel MOS transistor 61 is conductive. As a result, the global bit line GBL and the sense amplifier 35 are connected; the sense amplifier 35 compares a read current IREAD flowing in the global bit line GBL and the value of the reference current IREF, and outputs read data in accordance with size relationship thereof. The register 37 latches the outputted read data.

In a column command operation in the access, the register 37 performs data transfer with the outside via an input output terminal IOD and an inverted input output terminal /IOD. The N-channel MOS transistors N03 and N04 within in the column decoder 22 receive a Y switch selection signal YS by a gate, and are selectively connected to the input output terminal IOD and the inverted input output terminal /IOD of the register 37, and the I/O line pair 89. Data input and output are performed between the register 37 selected by the Y switch selection signal YS, and the outside. It is to be noted that the Y switch selection signal YS is a signal obtained by the column decoder 22 decoding a column address.

The write control circuit 51, in a case of writing to a corresponding register 37 selected by the Y switch selection signal YS in a page access period, performs control to write, to a memory cell, the data of the register 37 by driving the GBL driver 52. Specifically, by a write command being inputted during the page access period, the write enable signal WE is controlled, to a high level, and when the Y switch selection signal YS selected according a column address is controlled to a high level, the potential of node A01 is set to a low level.

In a precharge command operation in access, the write control circuit 51 performs control so that only the data of the register 37 for which writing is performed is written to a memory cell in a cell write period in response to the precharge command.

In the cell write period corresponding to the precharge command, each, of the write pulses /WP1 and /WP0 are driven at a pulse width set by the write pulse width monitor. The selector 62 selects the write pulses /WP1 and /WP0 corresponding to write data indicated by the inverted input out put terminal /IOD, and controls the GBL driver 52. As a result, the global bit line GBL is driven to voltage VDD or VSS according to data of the inverted input output terminal /IOD, and data is written to the memory cell.

In access to a general DRAM, data writing to a memory cell by a sense amplifier is an operation performed in response to a column command, but the writing disclosed here is an operation performed in response to a precharge command.

By this type of control, among 512 of the resisters 37 of one page, only the register for which writing is performed is a target for a cell write operation. As a result, among the 512 data bit cells of one page, control is performed to an actual write state, the number of data bit cells to which a write current flows is reduced, and power consumption of the semiconductor device 1 is reduced.

In a page access period, since writing is limited to data held by the register 37, even using an STT-RAM memory cell with a long time of writing to a memory cell in comparison to a general DRAM, the cycle time for column access does not increase.

Circuit area required for performing the above-mentioned control (the area of the respective circuits shown in FIG. 10) increases in comparison to sense amplifier usage as in DRAM (Dynamic Random Access Memory), for example. However, as shown in FIG. 3, since global bit line GBL interconnect pitch is relaxed to between several and several dozen times the local bit line LBL interconnect pitch, the interconnect pitch of circuits connected to these bit lines is also relaxed in comparison to DRAM. Therefore, layout of respective circuits as shown in FIG. 10 can be easily performed, and since the required number of circuits is decreased in comparison to DRAM, it is possible to curtail chip area.

Next, a description is given concerning operation of the semiconductor device 1 according to the first embodiment.

FIG. 11 is a diagram showing an example of an operation waveform (read/write operation) of the semiconductor device 1.

At time T01, when an active command ACT and a row address XA and a bank address not shown in the drawings are inputted, control is performed to have an inverted precharge signal /PC of the write control circuit 51 at the bank in question at a high level, and to have an inverted precharge /PC signal (not shown in the drawings) corresponding to the row address XA at a low level. Thereafter, the word line WL selected by the row address XA is controlled to a high level (voltage VPP).

Thereafter, when a read poise signal RP is controlled to a high level for a predetermined period, the potential of the global bit line GBL is driven to a read voltage VREAD from the common source voltage VCS, and the read current IREAD flows in the global bit line GBL. By sense-latching the read current IREAD, data of the input output terminal IOD and the inverted input output terminal /IOD is updated in response to the read data.

At time T02, a page access period occurs, and when a read command RD, a column address YA and a bank address not shown in the drawings are inputted, a Y switch selection signal YSi is controlled to a high level for a predetermined period in response to a column address YA in the bank in question, and data of the input output terminal IOD and the inverted input output terminal /IOD is read to the I/O line pair 89.

At time T03, when a write command WT, a column address YA and a bank address not shown in the drawings are inputted, a write enable signal WE at the bank in question is controlled to a high level for a predetermined period, and the Y switch selection signal YSi is controlled to a high level for a predetermined period. As a result, data of the input output terminal IOD and the inverted input output terminal /IOD is inverse-written from the I/O line pair 89. In this regard, in a period in which the Y switch selection signal YSi has a high level and the write enable signal WE has a high level, node A01 transitions to a low level.

At time T04, when the precharge command PRE is inputted together with a bank address that is not shown in the drawings, a cell write operation is started in the bank in question; thereafter when the write pulses /WP1 and /WP0 are controlled to a low level for a predetermined period in accordance with pulse width of each thereof, in accordance with the write data for example, the global bit line GBL1 is driven to a high level and the global bit line GBL0 is driven to a low level, and inverted data is written to a data bit cell. Thereafter, the word line WL is controlled to a low level, and after that, by an inverted precharge signal /PC being controlled to a low level and the node A01 being precharged to a high level, a series of page access operations is completed.

It is to be noted that in addition to a case where the precharge command is applied from outside, it may be automatically issued after completion of a read or write operation by a read or write command accompanying a precharge operation. In such a case also, the semiconductor device 1 operates similarly to a case where the precharge command is issued from outside.

As described above, in the semiconductor device 1 according to the first embodiment, the memory array replica 202 that is a replica circuit of the memory cell array, and the write circuit replica 201 that is a replica circuit of the GBL driver 52 are used to set the pulse width of the write pulses /WP1 and /WP0, based on a result of measuring pulse width when writing data to the memory cell. More specifically, the pulse width (pulse width when writing data "1") in a case of writing from a magnetic tunnel junction element (MTJ element) antiparallel state to a parallel state, and the pulse width (pulse width when writing data "0") in a case of writing from a parallel state to an antiparallel state, are alternately measured using a replica circuit a predetermined number of times, and the longest pulse width for writing with regard to each thereof, is used to set the write pulse width used in normal writing.

The spin injection magnetization reversal type of magnetic random access memory (STT-RAM) has a characteristic where time required for reversing a state of the magnetic tunnel junction element is probabilistically distributed. Based on this characteristic, it is considered useful to use the maximum value of the plural monitor measurements as the optimum write pulse duration.

In respective embodiments of the present disclosure, write errors are minimized by using the characteristic described above and using the maximum value of the plural monitor measurements as the optimum write pulse duration. By extension, unnecessary prolongation of write time is prevented. The maximum value of the plural monitor measurements is used as the optimum write pulse width in normal data writing.

In order to adjust pulse duration to the optimum value, the present embodiment is applicable to a write method using (i) 1 write pulse with a long time of application, as described above.

It is to be noted that in the technology of the Non-Patent Literature 1, there is a problem in that since current is consumed every time the state of the magnetic tunnel junction element is read, there is an increase in power consumption when data writing is performed. However, this type of problem does not occur with the semiconductor device 1 according to the first embodiment.

Second Embodiment

FIG. 12 is a diagram showing an example of an internal configuration of a write pulse width sampling circuit 102a and a write pulse generation circuit 103 according to a second embodiment.

In the first embodiment a description was given of a case where an activation interval of a pulse width monitor sequence is determined, at a predetermined time interval by a measurement interval timer 311, but there is no limitation to the activation interval of the pulse width monitor sequence. In the second embodiment, a description is given below of a trigger for pulse width monitor sequence activation, and an implemented circuit.

The second embodiment is a configuration in which chip temperature fluctuation range is set in advance in a mode register 14, and when the fluctuation range is exceeded, the pulse width monitor sequence is activated.

Specifically, the write pulse width sampling circuit 102a, as shown in FIG. 12, is provided with a chip temperature detection circuit 313 instead of the measurement interval timer 311 shown in the first embodiment (FIG. 8). A write pulse width monitor control circuit 310a confirms output of the chip temperature detection circuit 313 at regular intervals, and when the temperature fluctuation in the semiconductor device 1 exceeds a prescribed range, activates the pulse width monitor sequence. The configuration otherwise is similar to the first embodiment described above.

In the semiconductor device 1 of the second embodiment, a routine for setting a write pulse width is repeated, not at predetermined time intervals, hot according to the chip temperature fluctuation range. As a result, it is possible to compensate for temporal fluctuation of chip temperature.

Third Embodiment

FIG. 13 is a diagram showing an example of an internal configuration of a write pulse width sampling circuit 102b and a write pulse generation circuit 103 according to a third embodiment.

The third embodiment is a configuration in which a fluctuation range of a power supply voltage is set in advance in a mode register 14, and when the fluctuation range is exceeded, the pulse width monitor sequence is activated.

Specifically, the write pulse width sampling circuit 102b, as shown in FIG. 13, is provided with a power supply voltage fluctuation detection circuit 314 instead of the measurement interval timer 311 shown in the first embodiment (FIG. 8). The write pulse width monitor control circuit 310b confirms output of the power supply voltage fluctuation detection circuit 314 at regular intervals, and when the fluctuation of the power supply voltage of the semiconductor device 1 exceeds a prescribed range, activates the pulse width monitor sequence. The configuration otherwise is similar to the first embodiment described above.

In both a case where the chip temperature fluctuation range is a trigger for sequence activation, and a case where the power supply voltage fluctuation range is a trigger for sequence activation, since the basic activation sequence has no point of difference from activation of a pulse width monitor sequence using the measurement interval timer 311, further descriptions are omitted.

In the semiconductor device 1 of the third embodiment, a setting routine for a write pulse width is repeated, not at predetermined time intervals, but according to power supply voltage fluctuation range. As a result, it is possible to compensate for temporal fluctuation of the power supply voltage.

As an example, a margin may be added to the longest pulse width that was set using a replica circuit, to set a write pulse width. Or, an upper limit may be set in advance for the write pulse width, and in a case where the longest pulse width measured using the replica circuit exceeds the upper limit, the upper limit value set in advance may be used. The upper limit value may be used to exclude a very long write pulse width that occurs with low probability at a level that does not cause a problem in normal usage. In such cases, the abovementioned margin value and the write pulse width upper limit may be set in the mode register 14 in advance. In such cases also, since the basic operation sequence does not change, a description thereof is omitted.

As another example, two or more of the respective first to third methods described above may be suitably combined. A configuration is also possible in which two or more of (i) a predetermined time interval, (ii) a chip temperature fluctuation range, and (iii) a power supply voltage fluctuation range, are combined, and the abovementioned measurement operation sequence is executed in response to detection of a trigger of any thereof. For example, FIG. 12 has a configuration in which an OR logic circuit is added, output of a chip temperature detection circuit 313 of FIG. 12 is received as one input, and output of the power supply voltage fluctuation detection circuit 314 shown in FIG. 14 is received as another input, and the output is supplied to a write pulse width monitor control circuit 310a.

Fourth Embodiment

A description is given concerning a fourth embodiment, making reference to the drawings.

FIG. 14 is a diagram showing an example of a circuit configuration principally used in data bit reading and writing in the semiconductor device according to the fourth embodiment.

Instead of the write control circuit 51 shown in the first embodiment (FIG. 10), a write control circuit 51a according to the fourth embodiment is disclosed is disclosed in FIG. 14. Since the respective components otherwise do not differ from the respective components of the first embodiment, a description thereof is omitted here. In FIG. 14, component elements the same as in FIG. 10 are given the same symbols and a description thereof is omitted.

Referring to FIG. 14, the write control circuit 51a is configured to include an exclusive OR circuit EXOR01, a latch 63, and an N-channel MOS transistor N10.

In the write control circuit 51 according to the first embodiment (FIG. 10) a transistor 05 is present and a YS signal is received at a gate of a transistor 07, but in the write control circuit 51a according to the fourth embodiment the transistor 05 is not present, and the YS signal is not received at a gate of the transistor 07. These types of circuit configurations are different.

The write control circuit 51a takes into a latch 63, read data from a data bit cell, in a period in which a read pulse signal RP is at a high level. In this regard, only in a case where data written to an inverted input output term in /IOD is different from data of the data bit cell first taken into the latch 63, a node A01 is controlled to a low level.

As a result, since a global bit line GBL is driven only in a case where inverted data is written to the data bit cell, it is possible to further reduce write current more than in the semiconductor device 1 according to the first embodiment.

FIG. 15 is a diagram showing an example of an operation waveform of the semiconductor device according to the fourth embodiment.

In an operation after a write command WT is inputted, in an operation waveform shown in FIG. 15 (the fourth embodiment), a YS signal transitions to high, and when an input output terminal IOD and the inverted input output terminal /IOD are inverted, since the gate of the transistor 07 is controlled in response thereto, the node A01 transitions to a low level. Otherwise, in an operation waveform shown in FIG. 11 (the first embodiment), the node A01 transitions to a low level, by the YS signal transitioning to high only. According to the above-mentioned circuit configuration difference, this operation waveform is different. Next, a description limited to this point of difference is given, and other descriptions are omitted.

At time T01, when an RP signal transitions to a high level in accordance with supply of an active command, a transistor N10 of the write control circuit 51a is turned ON, and data held by a register 37 is sent from the register 37 to a latch 63, and the latch takes and holds in the data.

At time T03, when the YS signal transitions to a high level in accordance with supply of a write command WT, corresponding column decoders N03 and N04 are turned ON, and data supplied from an I/O line pair 89 by the register 37 is held. An exclusive OR circuit EXOR01 performs a logic operation on data held by the register 37 and data held by the latch 63 described above.

At time T03-1, the exclusive OR circuit EXOR01 controls the gate of the transistor N07, in accordance with a result of the logic operation.

Here, only in a case where data supplied together with the write command WT, and data held by the register 37 are different, that is, a case where data stored in a memory cell and newly supplied write data are different (a case of writing inverted data) the transistor N07 is turned ON, and potential of the node A01 is voltage VSS.

At T04, write pulses (/WP0 and /WP1) transition to low, in accordance with, supply of a precharge command.

Here, only in a case where the potential of the node A01 is the voltage VSS, global hit lines GBL1 and GBL0 are driven (as shown in FIG. 11, GBL0 has a low level, and GBL1 has a high level).

Also in a semiconductor device 1a according to the fourth embodiment, by using the maximum value of plural monitor measurements, there are few errors, and it is possible to prevent unnecessary prolongation of write time.

In addition, since a global bit line GBL is driven only in a case where inverted data is written to the data bit cell, it is possible to reduce write current more than in the semiconductor device 1 according to the first embodiment.

Fifth Embodiment

A description is given concerning a fifth embodiment making reference to FIG. 16.

FIG. 16 is a block diagram showing a configuration of an information processing system according to the fifth embodiment.

The fifth embodiment is a configuration of an information processing system including a semiconductor device (described here as semiconductor device 1) according to the respective embodiments described above, and a multi-core processor 501 (host 501).

The multi-core processor 501, as shown in FIG. 16, is configured to include core__1 to core__4 (502a to d), I/O 503, an external storage device control block 504, and an on-chip memory 505. The external storage device control block 504 controls the semiconductor device 1 by exchanging a command signal, an address signal, and a data signal, with the semiconductor device 1.

As one example, the measurement interval timer 311 according to the first embodiment may be configured to be arranged, not in the semiconductor device 1, but in the multi-core processor 501, for example, in the external storage device control block 504, and the configuration may be such that a measurement operation cycle is managed by the multi-core processor 501.

As another example, a configuration is possible in which a parity bit is added in the semiconductor device 1, error correction using ECC is performed by the host 501, and the configuration may change the number of measurements or measurement interval as set in a mode register 14 in accordance with error detection frequency, margin added to the longest measured pulse width, or an upper limit of a write pulse width. An error correction function using ECC may be given to the semiconductor device 1 itself, and error information sent to the host 501. By performing control in this way, it is possible to extract the greatest effect of the present disclosure.

For example, the host 501 may have a configuration in which an error detection unit is provided within the external storage device control block 504, and this error detection unit may detect an error generated by reading a memory cell of the semiconductor device 1; and in a case where detection frequency is high, an instruction is generated. In response to this instruction, the host 501 may have a configuration that sends to the semiconductor device 1 an instruction to change a parameter such as write pulse duration or the number of measurements used in acquisition thereof.

According to the information processing system according to the fifth embodiment, it is possible to provide, for the multi-core processor 501, a main memory in which current consumed when writing is curtailed while speeding up write time, using a variable resistance memory cell. Furthermore, it is possible to realize a specification equivalent to DRAM, curtailing increase in column access cycle time in page mode operation.

It is to be noted that a description was given of a case, with regard to the semiconductor device disclosed in the respective embodiments, where STT-RAM is used to perform spin injection magnetization reversal writing as a variable resistance element, but there is no limitation thereto, and within a scope that does not depart from the invention, it is possible to apply the disclosed content of the respective embodiments to a semiconductor device using, for example, Re-RAM (Resistance-Random Access Memory) that uses a metal oxide or the like, or Phase Change Memory (PCM).

It is to be noted that the disclosure of the abovementioned cited Non-Patent Literature 1 is incorporated herein by reference thereto. Modifications and adjustments of embodiments and examples may be made within the bounds of the entire disclosure (including the scope of the claims) of the embodiments of the present invention, and also based on fundamental technological concepts thereof. Furthermore, various combinations and selections of various disclosed elements (including respective elements of the respective claims, respective elements of the respective exemplary embodiments and examples, respective elements of the respective drawings, and the like) are possible within the scope of the claims of the present invention. That is, the present invention clearly includes every type of transformation and modification that a person skilled in the art can realize according to the entire disclosure including the scope of the claims and to technological concepts thereof. In particular, with regard to numerical ranges described in the present specification, arbitrary numerical values or small ranges included in the relevant ranges are to be interpreted to be specifically described where there is no particular description thereof.

What is claimed is:

1. A method, comprising:
measuring a first pulse width of a resistance variable memory cell coupled between a first terminal and a second terminal, the first pulse width including a period from starting a first data writing of the resistance variable memory cell by applying a voltage between the first and second terminals to ending the first data writing of the resistance variable memory cell;
measuring a second pulse width of the resistance variable memory cell coupled between the first and the second terminal, the second pulse width including a period from starting a second data writing of the resistance variable memory cell by applying a voltage between the first and second terminals to ending the second data writing of the resistance variable memory cell; and
setting longer one of the first and second pulse widths in a first storage area as a pulse width to be used in program.

2. The method according to claim 1, comprising:
determining the ending of the first data writing and the second data writing, respectively, by detecting a voltage level of a signal generated based on a second resistance state of the memory cell, the second resistance state being different from a first resistance state.

3. The method according to claim 2, comprising:
determining the starting of the first data writing and the second data writing, respectively, by detecting a voltage level of a signal generated based on the first resistance state of the memory cell.

4. The method according to claim 1, comprising;
after setting the longer one of the first and second pulse widths in the first storage area as a pulse width to be used in program, measuring a third pulse width of the resistance variable memory cell, the third pulse width including a period from starting a third data writing of the memory cell by applying a voltage between the first and second terminals to ending the third data writing of the memory cell;
measuring a fourth pulse width of the resistance variable memory cell, the fourth pulse width including a period from starting a fourth data writing of the memory cell by applying a voltage between the first and second terminals to ending the fourth data writing of the memory cell; and
setting longer one of the third and the fourth pulse widths in a second storage area as a pulse width to be used in program.

5. The method according to claim 4, wherein the first storage area and the second storage area are physically the same area.

6. The method according to claim 1, wherein the memory cell comprises an STT-RAM (Spin Transfer Torque-Random Access Memory) cell.

7. A method, comprising:
performing a pulse width measurement operation on a first resistance variable memory cell to measure a first pulse width including a period from starting a first data writing of the resistance variable memory cell to ending the first data writing of the resistance variable memory cell;
repeating the performing of the pulse width measurement operation; and
programming a data bit into a second resistance variable memory cell according to a maximum one of the first pulse widths that have been measured in the pulse width measurement operations.

8. The method according to claim 7, wherein the pulse width measurement operation comprises:
applying a voltage to the first resistance variable memory cell;
detecting a level of a signal generated based on a first resistance state of the memory cell when applying the voltage to the first resistance variable memory cell; and
detecting a voltage level of the signal generate based on a second resistance state of the memory cell, the first and second resistance state being different from each other.

9. The method according to claim 7, wherein each of the first and the second memory cells comprises an STT-RAM (Spin Transfer Torque-Random Access Memory) cell.

10. A device, comprising:
a memory cell array including a memory cell in which a resistance state changes in accordance with a bias being applied;
a replica memory cell replicating the memory cell of the memory cell array;
a measurement circuit measuring a bias application period required for changing a resistance state of the replica memory cell; and
a circuit determining a maximum one of the bias application periods that the measurement circuit has measured.

11. The device according to claim 10, comprising:
a control circuit writing a data bit to the memory cell, by applying to the memory cell a bias having the maximum bias application period that the circuit has determined.

12. The device according to claim 10, wherein the measurement circuit is configured to perform, in a plurality of times, measurements of the bias application periods.

13. The device according to claim 10, comprising:
a temperature detection circuit measuring chip temperature to produce a first detection signal, wherein
the measurement circuit is activated to measure the bias application period by the first detection signal.

14. The device according to claim 10, comprising:
a voltage detection circuit detecting change of power supply voltage to produce a second detection signal, wherein
the measurement circuit is activated to measure the bias application period by the second detection signal.

15. The device according to claim 10, wherein
each of the memory cell and the replica memory cell is configured to be written to a first resistance state by applying a first current in a first direction, and be written to a second resistance state by applying a second current in a second direction opposite to the first direction.

16. The device according to claim 14, comprising:
a latch circuit holding first data obtained by a reading a resistance state of the memory cell, wherein
the control circuit, in a case where the first data held by the latch circuit and second data read from the memory cell are different, writes the second data to the memory cell.

* * * * *

UNITED STATES PATENT AND TRADEMARK OFFICE
CERTIFICATE OF CORRECTION

PATENT NO. : 9,263,115 B2  
APPLICATION NO. : 14/476433  
DATED : February 16, 2016  
INVENTOR(S) : Kajigaya Page 1 of 1

It is certified that error appears in the above-identified patent and that said Letters Patent is hereby corrected as shown below:

|  | Delete | Insert |
|---|---|---|
| Column 24, line 13, claim 8 | "the signal generate based" | --the signal generated based-- |

Signed and Sealed this  
Nineteenth Day of April, 2016

Michelle K. Lee  
*Director of the United States Patent and Trademark Office*